United States Patent [19]

So

[11] Patent Number: 4,528,498

[45] Date of Patent: Jul. 9, 1985

[54] FREQUENCY COMPENSATING CURRENT CIRCUIT FOR A CURRENT COMPARATOR CAPACITANCE BRIDGE

[76] Inventor: Eddy So, 18 Crownhill St., Ottawa, Ontario, Canada, K1J 7K4

[21] Appl. No.: 504,878

[22] Filed: Jun. 16, 1983

[51] Int. Cl.³ .............. G01R 11/52; G01R 27/26
[52] U.S. Cl. ............................. 324/59; 324/DIG. 1
[58] Field of Search .......... 324/59, 60 R, DIG. 1, 324/55, 57 R

[56] References Cited

FOREIGN PATENT DOCUMENTS 0270882 5/1971 U.S.S.R. ................................ 324/59
0277087 5/1971 U.S.S.R. ................................ 324/59

OTHER PUBLICATIONS

Foley, "Direct Reading Non-Frequency-Sensitive Current Comparator Bridges for Measurements of Capacitors & Reactors", IEEE Proceedings Southeast Con., Apr. 1979, pp. 337-340.

*Primary Examiner*—Stanley T. Krawczewicz
*Attorney, Agent, or Firm*—Edward Rymek

[57] ABSTRACT

A method and apparatus for rendering a high-voltage current-comparator capacitance bridge insensitive to frequency fluctuations when used for measuring inductance. A compensating current, proportional to twice the change in the current through the reference capacitor due to frequency fluctuations, is driven into the first comparator winding through which the current from the reference capacitor passes, resulting in a current in that winding having frequency characteristics similar to those of the current passing through the second winding which is connected to the inductance. This compensating current is derived from a reduced replica of the applied high-voltage by deriving a voltage signal which is a function of the frequency fluctuation, producing an amplitude controlled reduced replica voltage using the frequency fluctuation voltage and converting the amplitude controlled voltage to the compensating current for the first comparator winding.

4 Claims, 2 Drawing Figures

FREQUENCY COMPENSATING CURRENT CIRCUIT FOR A CURRENT COMPARATOR CAPACITANCE BRIDGE

BACKGROUND OF THE INVENTION

This invention is directed to a current comparator capacitance bridge for the measurement of inductance, and, in particular, to a frequency fluctuation compensation for such a bridge.

A current-comparator capacitance bridge which is adapted to the measurement of an inductance, such as an inductive shunt reactor, by providing the means to reverse the phase of the reactor current and tangent δ balance is described in the publication, "Measurement of Shunt Reactor Loss of High Voltage with an Alternating Current-Comparator Bridge", W. J. M. Moore et al, IEEE Trans. on Power Apparatus and Systems, Vol. PAS-92, No. 2, pp 662-667, March/April 1973. The comparison of an inductance to a capacitive reference results in a bridge which is frequency sensitive.

To overcome this deficiency, a modified current-comparator capacitance bridge was proposed in the publication, "Mesures des Pertes dans les Réactances Shunt EHT par un pont C-tan δ Insensibilisé aux Fluctuations de la Fréquence du Réseau", R. Malewski et al, Conference Digest IEEE Canadian Communications and Power Conference, Montreal, Canada, Oct. 18-20, 1978, ch. 1373-0, Reg. 7, pp 487-491. This proposed modified bridge was used in a study entitled, "Interlaboratory Comparison on EHV Shunt Reactor Loss Measurements", R. Malewski et al, IEEE Trans. on Power Apparatus and Systems, Vol. PAS-99, No. 4, pp 1634-1641, July/Aug. 1980. In this modified bridge, the comparator winding in the reference capacitor arm of the bridge, is driven by a current proportional to the integral of a voltage which is a reduced replica of the applied high voltage to the bridge. The frequency characteristics of the reference arm of this modified bridge thus simulate those of the reactor, and the operating difficulties of the current-comparator-based capacitance bridge due to slight variations in frequency are overcome. The accuracy and long-term stability of the current-comparator have been exchanged, however, for those of the electronic circuitry that has been inserted between the reference capacitor and the comparator winding.

A second method and apparatus for rendering a high voltage, current-comparator capacitance bridge insensitive to frequency fluctuations when used for measuring inductance is described in U.S. Pat. No. 4,477,772 issued on Oct. 16, 1984, in the name of Eddy So. However, this method and the first method referred to above, both require gain and phase adjustments.

SUMMARY OF THE INVENTION

It is therefore an object of this invention to render a current-comparator capacitance bridge insensitive to frequency fluctuations by current compensation without the need for a phase adjustment.

This and other objects are achieved in a current comparator capacitance bridge for measuring inductance wherein the bridge includes a first comparator winding connected to a reference capacitor, second comparator winding for connection to the inductance, and a comparator amplifier connected to the first comparator winding for providing an output voltage which is a reduced replica of the voltage applied to the bridge.

The bridge is rendered insensitive to frequency fluctuations by a compensating current circuit which includes a first element for deriving a signal which is a function of the frequency fluctuation, a second element coupled to the first for producing an amplitude controlled replica voltage, and a third element for converting the amplitude controlled replica voltage to a compensating current which is driven into the second comparator winding.

The first element may include a frequency-to-voltage converter for receiving the reduced replica voltage to produce a voltage signal that is a function of its frequency, a dc reference voltage source; a summing circuit for comparing the outputs of the frequency-to-voltage converter and the dc reference voltage sources. The second element may include an adjustable gain amplifier coupled to the output of the summing circuit and a multiplier circuit with a first input connected to the amplifier and a second input for receiving the reduced replica voltage. The third element may include a capacitor coupled between the multiplier circuit and the first comparator winding.

Many other objects and aspects of the invention will be clear from the detailed description of the drawings.

DETAILED DESCRIPTION

Figure 1:
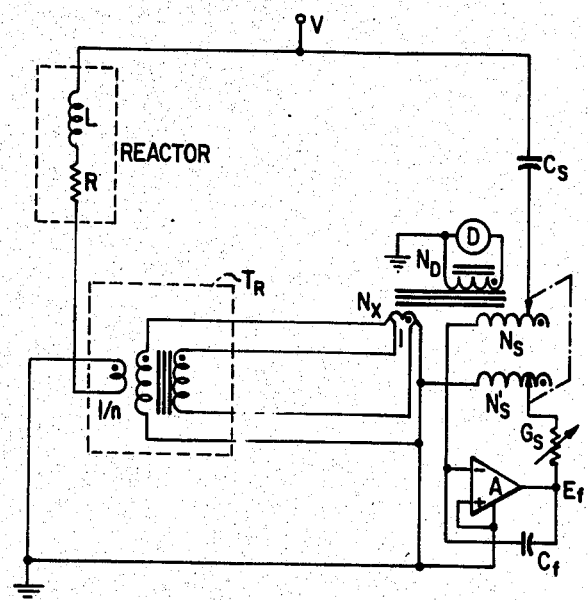
FIG. 1 illustrates a prior art current-comparator capacitance bridge.

FIG. 1 shows the basic current-comparator capacitance bridge described in the above referenced 1973 publication by W. J. M. Moore et al, which is incorporated herein by reference. The bridge consists essentially of a current comparator which compares the current from a standard high voltage capacitor $C_S$ with the current from an inductive reactor L-R to be measured. The current comparator includes first winding $N_S$ connected to the reference capacitance $C_S$, second winding $N_X$ connected to the inductance L-R, and detector winding $N_D$. In FIG. 1, the current from the inductor L-R has been reduced and inverted in phase by a two-stage, n/1 ratio, current transformer $T_R$. Quadrature balance is obtained from an operational amplifier A with a feedback capacitor $C_f$ and an adjustable conductance $G_S$ connected to a winding $N_S'$ of the same number of turns as winding $N_S$. The bridge is balanced by adjustment of $N_S$ and $G_S$. The current through the reference capacitor $C_S$ is passed to the comparator winding $N_S$ and thence to the input of operational amplifier A, which is virtually at ground potential. The output voltage $E_f$ of amplifier A is a replica of the applied high-voltage V but reduced in magnitude by the ratio $C_S/C_f$. This voltage $E_f$, with conductance $G_S$ and the first comparator winding $N_S'$ provides the direct indication of tangent δ. The inductive balance of this bridge is sensitive to the square of the frequency, but the conductance $G_S$ or tangent δ balance is frequency independent.

Figure 2:
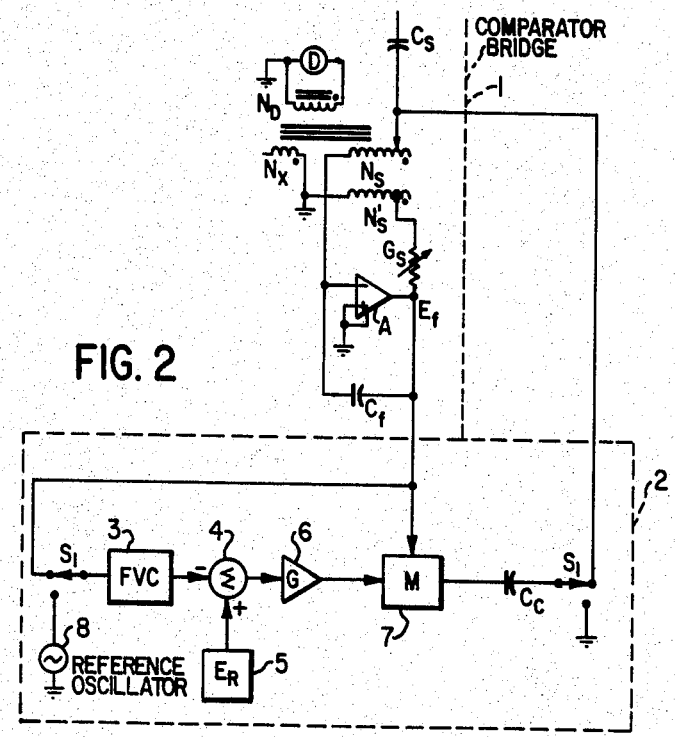
FIG. 2 illustrates a compensating current circuit in accordance with the present invention.

The compensating current circuit in accordance with the present invention is described with respect to FIG. 2. In accordance with the present invention, a compensating current circuit 2 is connected to the comparator bridge 1 as shown in FIG. 2 whereby the voltage $E_f$, which is a replica of the applied high voltage V, is used to derive the compensating current which is driven into the comparator winding $N_S$ of the comparator bridge 1. The bridge will generally operate at a standard frequency of 50 Hz or 60 Hz.

The compensating current circuit includes a frequency-to-voltage converter 3 which provides an output voltage that is proportional to the detected frequency of signal $E_f$. The converter 3 may be an integrated circuit followed by a low-pass filter. It is preferred that it have a linearity error in the order of less than ±0.01% of full scale and a temperature coefficient of approximately −100 ppm/°C. The output of converter 3 is fed to a summing circuit 4 together with a reference voltage $E_R$ from a stable dc reference source 5. The reference source 5 may be a monolithic bandgap voltage reference which is preferred to have a temperature coefficient in the order of less than 10 ppm/°C. and an output voltage noise of less than 30 μV peak-to-peak. The output from the summing circuit 4 is amplified in amplifier 6 which has a gain G. This amplified difference signal is applied to multiplier 7 to be multiplied by the voltage $E_f$ from the comparator bridge. The output is connected to a capacitor $C_c$ by which the compensating current is driven into winding $N_S$ of the comparator bridge 1. Multiplier 7 may be a four-quadrant precision integrated circuit multiplier and is preferred to have a nonlinearity and feed-through error of less than ±0.01%. The capacitor $C_c$ may be a solid dielectric capacitor of the polystyrene type, with a temperature coefficient and a dissipation factor at the power frequencies of preferably in the order of −100 ppm/°C. and +100 ppm, respectively.

The ac output voltage from multiplier 7 is a function of the power frequency fluctuations which are detected in summing circuit 4. By proper adjustment of the gain in amplifier 6, the compensating current is proportional to twice the change in current through the reference capacitor $C_S$ in the comparator bridge 1, due to frequency fluctuations. The resulting current in the comparator winding $N_S$ is a current with a frequency characteristic similar to that of the current through the shunt reactor L-R. For correct compensation, the following relationship must be satisfied:

$$G \times SF = 2\, C_f/C_C \qquad (1)$$

where
G is the gain of amplifier 6,
SF is a scale factor, equal to the magnitude of the dc reference 5.

For a 10 V dc reference, SF is equal to 10. The gain G of amplifier 6 is made adjustable. Thus, only gain (or magnitude) adjustment is required for correct compensation. Phase adjustment is not required. The compensating current need not be supplied with great accuracy for it is only a small fraction of the current through the reference capacitor $C_S$. For a change of 0.1 1 Hz in the 60 Hz or 50 Hz test-voltage frequency, the compensating current is (2×0.17) percent or (2×0.20) percent, respectively, of the current through the reference capacitor $C_S$.

The balance equations of the bridge may be derived from the current comparator ampere-turns balance condition. For an applied voltage, V, $$\frac{V}{(R+j\omega L)} \cdot \frac{1}{n} \cdot 1 = -(V \cdot j\omega C_S - 2\alpha \cdot V \cdot j\omega C_S) \cdot N_S +$$

-continued $$V \cdot \frac{C_S}{C_f} \cdot (1 - 2\alpha) \cdot G_S \cdot N_S \text{ or}$$

$$j\omega L\,(1 - jR/\omega L) =$$

$$j(1 - jG_S/\omega C_f)/nN\omega_S C_S(1 - 2\alpha) \cdot (1 + G_S^2/\omega^2 C_f^2)$$

where, $\omega$ is equal to 107$_o$(1+α); $\omega_o$ and α are, respectively, the angular frequency and the fractional change of the nominal test-voltage frequency.

The balance equations, for $\alpha^2 << 1$ and $G_S^2/\omega^2 C_f^2 << 1$, are therefore, $$L \simeq 1/nN_S C_S \omega_o^2$$

and $$\tan \delta = R/\omega L = G_S/\omega C_f$$

The conductance $G_S$ is calibrated for direct reading in loss tangent at the exact test-voltage frequency. Thus, the inductance and tan δ obtained from the bridge balance are, respectively, the shunt reactor equivalent inductance and loss tangent at exactly 60 Hz and 50 Hz, independent of the test-voltage frequency fluctuations.

The compensating current circuit 2 may be calibrated by a procedure using the comparator bridge 1 itself. The frequency-to-voltage converter 3 is standardized at the proper test-voltage frequency, using a reference oscillator 8, to give an output voltage equal to the dc reference source 5 at the voltage $E_R$. The reference oscillator 8 is connected into the circuit and capacitor $C_C$ is grounded by throwing the common switch $S_1$. Oscillator 8 may be an amplitude controlled digital oscillator such as the one described in U.S. Pat. No. 4,315,219, which issued on Feb. 9, 1982 in the names of D. O. Rocheleau and K. Ayukawa. It will also have two operating modes, providing either a 60 Hz or 50 Hz reference signal, and should have a frequency accuracy and stability in the order of 35 10 ppm and 35 2 ppm, respectively. In accordance with the procedure, the bridge 1 is then used as a capacitance bridge and is balanced with an adjustable-frequency low-voltage source and two stable low-loss capacitors. The frequency is standardized by adjusting it to give the same frequency-to-voltage converter 3 output as produced with the reference oscillator 8 as the frequency source. A short term frequency stability is needed. The frequency is then changed by a convenient amount, e.g. 0.1%, and the gain of amplifier 6 is adjusted to give a change in the capacitive balance of twice the change in frequency (0.2%). If the bridge is balanced using an inductor and a capacitor, then adjustment of the gain of amplitude 6 is for no change in the inductive balance. Once the gain is properly adjusted, it normally does not require recalibration for future use of the circuit 2. Changes in gain due to temperature variations affect the inductive balance only by introducing an error of the second order which is negligible.

Many modifications in the above described embodiments of the invention can be carried out without departing from the scope thereof and, therefore, the scope of the present invention is intended to be limited only by the appended claims.

I claim:

1. In a current comparator capacitance bridge for measuring inductance wherein the bridge includes first comparator winding means connected to a reference capacitor, second comparator winding means for connection to the inductance, and a comparator amplifier connected to the first comparator winding for providing a reduced replica of a voltage applied to the bridge, a compensating current circuit for rendering the bridge insensitive to frequency fluctuations comprising:

first means for deriving a signal as a function of the frequency fluctuation;

second means coupled to the first means for producing an amplitude controlled replica voltage; and third means for converting the amplitude controlled replica voltage to a compensating current for application to the first comparator winding means.

2. Compensating current circuit as claimed in claim 1 wherein the first means includes:

frequency-to-voltage converter means for receiving the reduced replica voltage;

dc reference voltage means; and summing means for comparing the outputs of the frequency-to-voltage converter means and the dc reference voltage means.

3. Compensating current circuit as claimed in claim 2 wherein the second means includes:

an adjustable gain amplifier means coupled to the output of the summing means; and multiplier means having a first input connected to the amplifier means and a second input for receiving the reduced replica voltage.

4. Compensating current circuit as claimed in claim 3 wherein the third means includes capacitance means coupled between the multiplier means and the first comparator winding means.

* * * * *